US006750152B1

(12) United States Patent
Christenson et al.

(10) Patent No.: US 6,750,152 B1
(45) Date of Patent: Jun. 15, 2004

(54) METHOD AND APPARATUS FOR ELECTRICALLY TESTING AND CHARACTERIZING FORMATION OF MICROELECTRIC FEATURES

(75) Inventors: John Carl Christenson, Kokomo, IN (US); Steven Edward Staller, Russiaville, IN (US); John Emmett Freeman, Kempton, IN (US); Troy Allan Chase, Kokomo, IN (US); Robert Lawrence Healton, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/411,339

(22) Filed: Oct. 1, 1999

(51) Int. Cl.⁷ .............................................. H01L 21/00
(52) U.S. Cl. .................. 438/735; 73/517 R; 216/2; 216/61; 216/86; 438/17; 438/719; 438/8
(58) Field of Search ................. 216/2, 14, 59, 216/61, 84, 86; 438/8, 9, 14, 17, 689, 719, 753, 735, 743; 324/661, 676; 73/517 A, 517 R

(56) References Cited

U.S. PATENT DOCUMENTS 5,251,484 A    10/1993   Mastache ................. 73/517 A

OTHER PUBLICATIONS

"Rejecting Rotational Disturbances on Small Disk Drives Using Rotational Accelerometers" Daniel Y. Abramovitch, 1996 IFAC World Congress in San Francisco, CA 1996, pp. 1–6.

"Increased Disturbance Rejection in Magnetic Disk Drives by Acceleration Feedforward Control and Parameter Adaption" M.T. White and M. Tomizuka, vol. 5, No. 6, 1997, pp. 741–751.

"Embedded Interconnect and Electrical Isolation for High–Aspect–Ratio, SOI Inertial Instruments" T. J. Brosnihan, J.F. Bustillo, A.P. Pisano and R.T. Howe, 1996 International Conference on Solid–State Sensors and Actuators, Chicago, Jun. 16–19, 1997, pp. 637–640.

Primary Examiner—William A. Powell
(74) Attorney, Agent, or Firm—Jimmy L. Funke

(57) ABSTRACT

A semiconductor wafer is etched to create an array of MEMS devices and at the same time, test sites having geometry which represent critical geometry of the MEMS devices. Probe contacts are provided in the test sites to permit measurement of resistance and capacitance between test site geometry as a way of determining the effectiveness of the etch. One test site comprises a ladder of semiconductor structures separated by gaps of graded width. Another test site comprises finger structures formed over a cavity and the probe contacts are located so as to detect inter-finger capacitance and resistance (or continuity) as well as intra-finger resistance.

16 Claims, 6 Drawing Sheets

METHOD AND APPARATUS FOR ELECTRICALLY TESTING AND CHARACTERIZING FORMATION OF MICROELECTRIC FEATURES

CROSS REFERENCE TO RELATED APPLICATION

This application discloses subject matter which is disclosed and claimed in co-pending U.S. application Ser. No. 09/410,713, filed Oct. 1, 1999, in the names of John Carl Christenson, Steven Edward Staller, John Emmett Freeman, Troy Allan Chase, Robert Lawrence Healton, and David Rich, and entitled "MEMS Sensor Structure and Microfabrication Process Therefor," the entire contents of which are incorporated herein by reference.

TECHNICAL FIELD

This invention relates to an apparatus and method for testing batch formed microelectronic devices to determine whether or not the batch forming methodology has been effectively carried out.

BACKGROUND OF THE INVENTION

Microelectronic circuit devices are typically batch formed by, for example, discretizing the locations and geometry of said devices in an essentially continuous layer of semiconductor material and thereafter exposing the discretized semiconductor material to a forming medium which removes material from the semiconductor layer except where it is protected by an etchant resistant material commonly called "photoresist." A representative forming process is known as inductively coupled plasma deep reactive ion etching (ICP DRIE) in which the forming medium is a reactive plasma. Removal of the semiconductor material by the etchant is essentially a trenching process which begins on one surface of the semiconductor material and progresses through the material at a rate which is dependent upon a number of factors, including the width of the trench. The fact that the etch process progresses at different rates for different gap widths is a phenomenon known as "etch lag" and must be addressed any time devices with different gap widths in their geometry are to be formed in a batch forming process such as ICP DRIE.

One environment in which the etch lag phenomenon is encountered is in the batch forming of micro-electromechanical systems commonly referred to as MEMS. MEMS devices include, by way of example, micromechanical filters, pressure sensors, gyroscopes, resonators, actuators, rate sensors, and accelerometers. A typical MEMS device is fabricated in large numbers by batch etching a semiconductor layer. The geometry of MEMS devices is typically such that a reasonably high level of accuracy is needed in maintaining the proper trench widths or gap sizes between the structural elements thereof so that electrical and/or mechanical interactions or effects between adjacent semiconductor structures are within acceptable levels. It is particularly important that adjacent semiconductor structures which are separated and electrically isolated from one another by a minimum width gap are in fact fully formed; i.e., it is important that the trench which forms the gap is etched through the appropriate semiconductor layer so that a short circuit does not occur between the two adjacent semiconductor structures, and so that mechanical structures are completely separated. Because of the etch lag phenomenon described above, it is possible in a batch etching process that the wider isolation gaps will be fully formed while narrower structural trenches in the device are not fully formed and that electrical short circuits or mechanical connections as described above will occur.

Many MEMS devices involve etch trenching or gap formation through a portion of semiconductor material which is suspended in part over a cavity so as to create the potential for physical movement between closely adjacent portions of the semiconductor structure. By way of example, an accelerometer may require the semiconductor layer at each device location to be etched in such a way as to form a linear or radially disposed array of essentially parallel narrow fingers of semiconductor material which are supported at one end, for example, on an oxide base but which extend from the oxide base out over a cavity in a cantilevered fashion. The structure of such a device is described in greater detail in the related application identified above, the disclosure of which is incorporated herein by reference.

Where a number of long parallel trenches are to be etched through the semiconductor material over a cavity, another phenomenon can affect the electrical properties of the semiconductor structures formed by etching. To explain, a wide trench designed for either electrical or structural isolation may form earlier than nearby narrow trenches in the etch process as a result of the etch lag phenomenon described above. Once the wider trench is fully formed, the etchant can fill the cavity and, because it is highly active, begin eroding the bottoms of the long fingers of semiconductor material which overlie the cavity. This undesirable etch can change finger bottom geometry from a relatively thick rectangular structure to one which begins to resemble a knife-edge, i.e., the edges of the fingers at or near the bottoms begin to erode inwardly from the corners. As this erosion continues, the electrical resistance of a finger of semiconductor material increases while the capacitive coupling between adjacent fingers may decrease.

In the past it has been customary to evaluate the qualities of the individual semiconductor devices and particularly their electrical characteristics by sacrificing an entire semiconductor wafer. To explain, wafers may be drawn at random from the manufacturing process and cut through so as to be prepared for either visual or machine assisted inspection. While this is wasteful of materials and manufacturing efficiency, it is preferable to separating the devices from the etched wafer and installing them in individual packages which are later found to be faulty.

SUMMARY OF THE INVENTION

According to the present invention, electronic devices such as, but not limited to, MEMS which are batch formed from an essentially continuous layer of semiconductor material may be tested to evaluate the effectiveness of the batch forming medium without sacrificing entire wafers.

In general this is accomplished through the steps of:

A. forming electrical test probe contacts in test sites;

B. discretizing, such as by application of a photoresist pattern layer, the locations and geometry of the devices in the semiconductor material layer wherein the geometry includes the definition of one or more gaps in the material layer which affect the electrical and/or mechanical properties of the devices;

C. discretizing one or more test sites in the semiconductor layer so as to include at least one gap which is dimensionally representative of a gap in the device geometry; thereafter D. subjecting the layer to the forming medium; and E. measuring at least one electrical property associated with the test site gap by probing the contacts described above.

The term "discretizing", as used herein, typically refers to the application and selective removal of photoresist to a surface of the semiconductor layer prior to exposing the layer to the etchant thereby to define those areas of the semiconductor layer where the etchant will trench through the material from the exposed side toward the other side. While this is the typical definition, Applicants intend this term to cover any and all known and future developed methods for creating the two-dimensional pattern which is ultimately desired in the semiconductor structure.

Furthermore, it is to be understood that, according to the present invention, steps (A), (B), and (C) can be performed in any desired order before performing step (D).

The method of the present invention can be applied as hereinafter described to the manufacture of MEMS devices in large quantities in wafers or sheets of semiconductor material which are fully bonded to a substrate as well as wafers or sheets which have cavities formed beneath the semiconductor layer. The test probe contacts may be arranged so as to permit the testing in the test sites of either or both of capacitance and resistance.

In one embodiment hereinafter described, the test site comprises a linear array of contacts separated by test site gaps which vary from one another in a systematic way; e.g., the gaps vary in width from one another by a fixed difference increment and define a range from a minimum value which is at or below the minimum gap width to a maximum value which is at or in excess of an isolation gap width such that the gaps in the devices to be batch formed all fall within the test site range whether or not they correspond exactly to any of the gap values in the range. Alternatively the gaps in the test site may be selected to correspond identically with the manufactured device gaps; the differences between these two approaches being a matter of individual preference. In the linear array, the gaps which are defined in the discretizing step; i.e., the application and selective removal of the photoresist pattern, are separated by untrenched, unetched semiconductor blocks and the entire linear array of blocks is separated from the rest of the semiconductor layer by way of an isolation gap defined in the discretizing step. Each of the blocks is preferably provided with a metalized layer which serves as a test probe contact. After the wafer has been etched, the test probe contacts may be accessed by suitable probes and the capacitance and resistance between contacts measured as an indication of the effectiveness of the etch process in the formation of other structures in the semiconductor layer which structures include geometry; i.e., trench widths, which correspond to or are represented by the linear gap array in the test site. In short, the test site acts as the representative of the entire wafer and the accuracy of this representation is assured by the fact that all areas of the wafer are etched at the same time.

The test site or sites may be strategically located throughout the device array or, where the value of surface area in the array is high, located in or along scribe streets or lines which will ultimately be used to separate devices from one another prior to further assembly steps. The test sites themselves perform no function after the test has been carried out and may be destroyed without loss.

Another embodiment of the invention, most advantageously applied in the testing of MEMS devices, involves a test site having long fingers of semiconductor structure formed in part over a cavity to both evaluate the trench formation as well as to characterize the long semiconductor structures to determine, for example, that they have not become excessively electrically resistive through undesirable etching as described above. In this embodiment, the test site is discretized in such a way as to create a geometry of long, narrow parallel fingers which partially overlie a cavity, which are separated by gaps of selected widths and which are implemented with probe contacts at the opposite supported ends thereof, i.e., the ends which overlie the substrate. In addition, leads are brought out from the test probe contacts in such a way as to facilitate the application of test probe electronics to the leads for evaluation not only of inter-digital capacitance, i.e., the capacitance across the various gaps, but also to quantify and/or measure for acceptability of the resistance of the individual fingers. Again, the geometry of the test site is chosen to be representative of the devices themselves in the wafer in which a numerically large array of devices is simultaneously formed along with the test sites.

As in the first embodiment, the test sites may be located in or along scribe lines where they will not reduce the manufacturing efficiency measured as a function of the utilization of wafer area.

In either or both of the embodiments, the probe contacts can be and preferably are interconnected with leads which themselves are geometrically arranged in a standardized fashion so that a single probe card may be designed for application to either or both of the first and second embodiment arrangements described above. It is not uncommon to advantageously use both the linear trench width test site monitoring array and the finger etch embodiments on a single wafer for multiple test purposes.

Advantages and applications of the present invention will become apparent to those skilled in the art when the detailed description of the best mode contemplated for practicing the invention, as set forth hereinbelow, is read in conjunction with the accompanying drawings.

BRIEF DESCRIPTION OF THE DRAWINGS

The present invention will now be described, by way of example, with reference to the accompanying drawings, in which.

DETAILED DESCRIPTION OF THE ILLUSTRATIVE EMBODIMENTS

Figure 1:
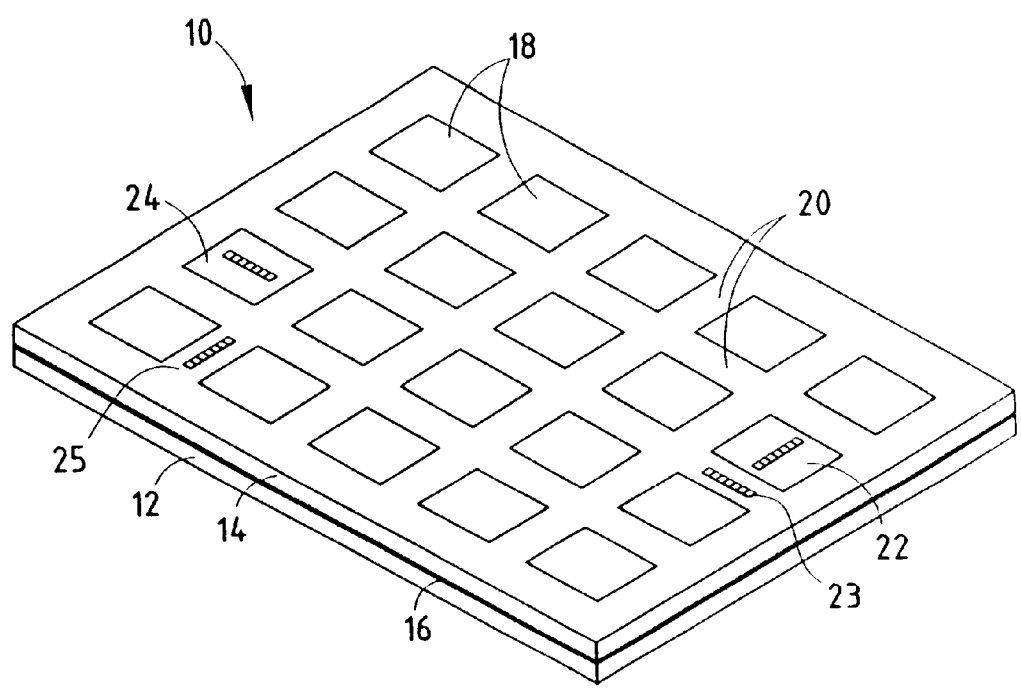
FIG. 1 is a perspective view of a prepared semiconductor wafer prior to etch and displaying eighteen device sites and two test sites.

Referring first to FIG. 1, there is shown in highly simplified and schematic form an integrated circuit device production wafer 10 comprising a dielectric and dimensionally stable substrate 12 having a doped and epitaxially grown semiconductor layer 14 bonded to the substrate 12 by an oxide layer 16. On the upper surface of layer 14 is an array of discretized manufactured device sites 18 and test sites 22 and 24 separated by scribe lanes 20. In addition, there are also test sites 23, and 25 which are located in the scribe lanes 20. Preferably, for example, the device sites 18 and the test sites 22 and 24 are formed on the die which are defined in the wafer 10. Test sites 23 and 25 are then, for example, formed in the scribe lanes 20 which separate the various die. The decision of where and when to include test sites on various die and/or within the scribe lanes is typically made by process engineers who desire to monitor certain processing steps of the fabrication process that is utilized to create the actual devices at the device sites 18.

The device sites 18 as well as the scribe lanes 20 are defined by the creation of geometrically predetermined patterns of photoresist prior to subjecting the wafer to, for example, a deep reactive ion etch treatment the details of which are omitted herein for brevity. Similarly, the geometric details of the test sites 22, 23, 24, and 25 are defined by the application of a photoresist pattern and by the same etch treatment, as hereinafter explained. In the case of the test sites, test probe contacts and conductive leads are additionally formed therein to facilitate electrically monitoring the progress of the etch treatment over the entire wafer.

It is to be understood that the geometry, proportions, and fine details of FIG. 1 are highly simplified and illustrated on a greatly altered scale to facilitate the following explanation. That is, the actual dimensions of microelectronic devices at the device sites may be in the submicron range and, therefore, the typical manufacturing wafer will contain not merely eighteen but normally hundreds of manufactured device sites. Moreover, while the ratio of manufactured device sites and test sites is shown in FIG. 1 at 9:1, the more typical ratio is at least 100:1, but may be higher or lower as suits the objectives of the particular designer.

Finally, while the test sites 22 and 24 are shown as if each such site would occupy the surface area (for example, an entire wafer die) which would otherwise be allocated to a manufactured device site, it is entirely possible and often preferable to locate the test sites in the scribe or saw lanes 20, as are test sites 23 and 25, since the utility of such test sites is temporary in nature. In light of such temporary utility, there is no loss in ultimately destroying and/or dispensing with the test sites (for example, when the wafer 10 is ultimately diced apart to separate the device sites 18) after their utilitarian purpose has been served and the wafer 10 has been fully processed and evaluated by the steps hereinafter described.

The actual etch process will not be described in detail here. Suffice it to say that the wafer 10 shown in FIG. 1 with the sites 18, 22, 23, 24, and 25, suitably defined on a surface thereof by layering with photoresist to outline the areas to be trenched, are subjected to an etch process which creates, in the semiconductor layer 14, the geometry of the manufactured device sites 18 as well as the test sites 22, 23, 24, and 25. Because the test sites 22, 23, 24, and 25 and device sites 18 are created at the same time by a common etchant, electrically probing the test sites 22, 23, 24, and 25 for certain electrical characteristics produces information concerning the effectiveness of the etch process in properly defining the physical structure of the manufactured devices formed at the device sites 18 on the wafer 10.

Figure 2:
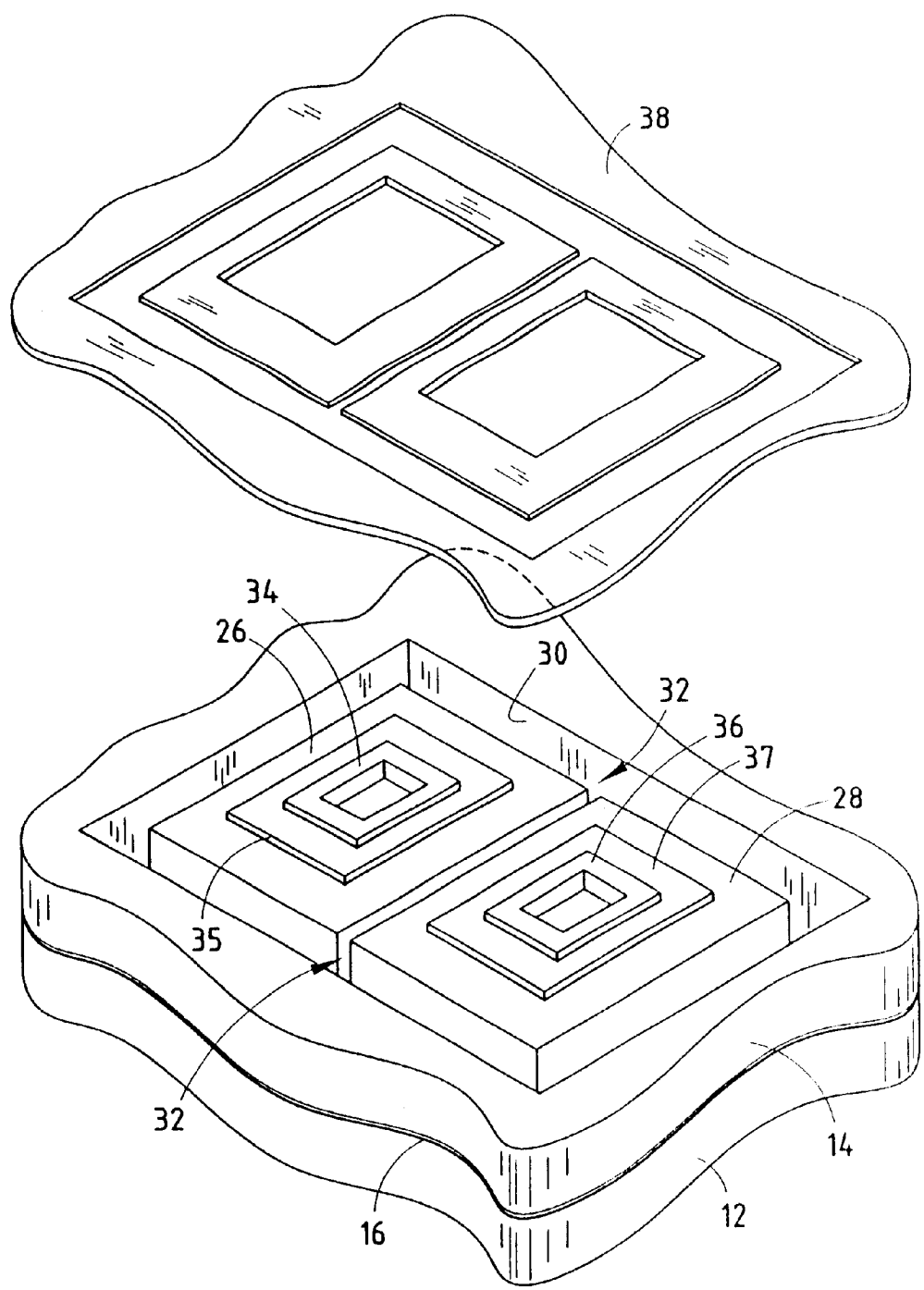
FIG. 2 is a perspective view of a representative test site, after etching, designed to test for short circuits and/or capacitance across a minimum capacitive gap between semiconductor structures in a production device formed on the same wafer by the same etch step which forms the structure shown in FIG. 2.

Referring now to FIG. 2, this figure provides,. for illustrative purposes, a perspective view of a very simple test site after completion of the etch process. The photoresist layer 38 which defines the physical features of FIG. 2 has been exploded away from the underlying structure to expose the semiconductor structure.

The FIG. 2 structure comprises a matched pair of semiconductor structures 26 and 28 which are essentially square in plan view and which are defined in the surrounding mass of the semiconductor layer 14 by means of an isolation trench 30 and, between the structures 26 and 28, a trench 32 representing a minimum gap to be found in manufactured device sites which are integral with the semiconductor layer 14 (but not shown in FIG. 2) and simultaneously formed therein as described above with reference to FIG. 1. In addition, the semiconductor structure 26 is provided with a metalized pad 34 on the top which serves as a test probe contact. The metalized pad 34 is formed over an opening in an underlying oxide layer 35 which thereby permits direct electrical contact between the pad 34 and the semiconductor structure 26. Similarly, the semiconductor structure 28 is provided with an overlying metalized pad 36 and an opening in an oxide layer 37 to provide a second test probe contact. In this way, the capacitance and/or resistance across the gap represented by trench 32 can be measured by electrically probing metalized pads 34 and 36. As a result, during the wafer fabrication process, the progress of the etch treatment, at the various device sites 18 on the entire wafer 10 can be indirectly monitored by electrically probing the metalized pads at the test site.

By way of further explanation, prior to the beginning of the etch treatment, neither the isolation trench 30 nor the minimum trench 32 exists. However, counterparts thereof are defined in the photoresist layer 38 by selective (i.e., masked) exposure and removal as is well known in the art. Probing the pads 34 and 36 prior to etch will reveal an electrical short and zero capacitance because neither the isolation trench nor the trench 32 has yet been formed (that is, etched) in the semiconductor layer 14. However, if the etch treatment is effective such that the trenches 30 and 32 are fully formed through the semiconductor layer 14 all the way to the electrically-insulating oxide layer 16, the semiconductor structures 26 and 28 will then be electrically isolated from one another, and the application of test probes to the contacts 34 and 36 will reveal a very high resistance value or, if a suitable signal is applied, a capacitive coupling across the trench 32. The width of the test site trench 32 is chosen to be representative of a critical trench width or gap to be formed in a manufactured device at a device site 18 (see FIG. 1) found at another location in the semiconductor layer 14 on the same wafer 10. Given that the devices at the device sites 18 and the test site structure of FIG. 2 are both substantially simultaneously created by the same etch treatment, if probing of the pads 34 and 36 indicates that trench 32 has not been properly etched to completion, then the etch treatment can then be deemed to be incomplete or ineffective over the entire wafer. In this way, the test site structure in FIG. 2 is used to indirectly determine whether the device site trenches which correspond in size to test site trench 32 are properly formed at the device sites on the wafer. If, for example, electrically-probing the pads 34 and 36 indicates that test site trench 32 is not properly formed, then the devices at the device sites on the same wafer will then be deemed defective.

Figure 3:
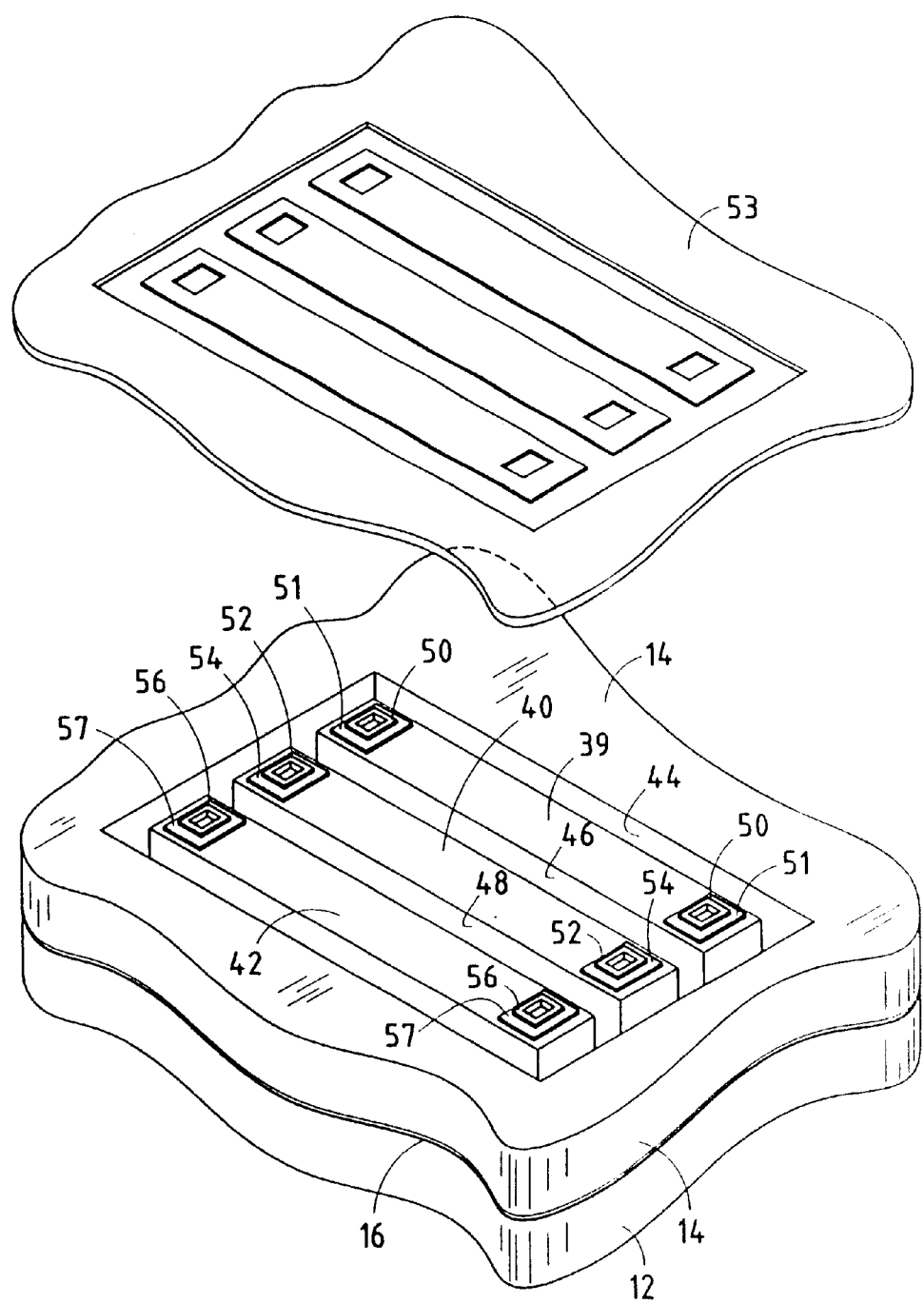
FIG. 3 is a perspective view of another test site, after etching, formed in a semiconductor/substrate wafer along with a number of geometrically related production devices wherein the test site is designed to test for short circuits, capacitance between semiconductor structural elements and resistance along an element.

For illustrative purposes, FIG. 3 shows another test site geometry, at the completion of the wafer etch treatment, which comprises the semiconductor layer 14, the substrate 12, and the oxide layer 16 as previously described with reference to FIG. 1. In this instance, the fully formed test site comprises elongate strip or finger-like semiconductor structures 39, 40, and 42 arranged in a parallel fashion. The structures 39, 40, and 42 are separated from the surrounding semiconductor layer 14 by an isolation gap 44 and from one another by smaller (i.e., narrower) gaps or trenches 46 and 48 which may be equal or non-equal to each other according to the objectives of the designer. Structure 39 is provided with test probe contacts 50 at its distal ends, structure 40 is provided with probe contacts 52 at its distal ends, and structure 42 is provided with probe contacts 56 at its distal ends. The probe contacts 50, 52, and 56 are in electrical contact with structures 39, 40, and 42 via holes in oxide layers 51, 54, and 57.

The test site shown in FIG. 3 is discretized relative to the surrounding layer 14 by means of a photoresist layer 53 which outlines the areas to be trenched. It is, of course, removed after the etch treatment is completed. It is important to note that the photoresist layer 53 is patterned such that trenches and gaps can be etched and such that probe contacts 50, 52, and 56 can be accessed by electrical probes. In this way, the progress of the,etch treatment can be simultaneously electrically monitored during etching.

Again, prior to the beginning of the etch treatment and/or at an incomplete stage of the etch treatment, the structures 39, 40, and 42 are all part of a common, substantially continuous structure represented by layer 14. Therefore, probing between one of contacts 50 and one of contacts 52, as well as probing between one of contacts 52 and one of contacts 56, will yield only the electrical information that short circuits exist therebetween. However, once the etch treatment is complete and the trenches 44, 46, and 48 are completely formed down to the electrically insulating oxide layer 16 (or, in the alternative, to an underlying cavity as the case may be), electrically probing between one of contacts 50 and one of contacts 52, as well as probing between one of contacts 52 and one of contacts 56, will indicate an open circuit to a DC or steady state signal and will indicate capacitive coupling (if the gap size permits) to a time-varying signal. Again, it is assumed that the widths of the trenches 46 and 48 are dimensionally related to gaps of interest in device sites integral with the layer 14 on the same wafer, and it is assumed that such test site trenches are formed (that is, etched) at the same time and by the same etch treatment as are the devices at the device sites. It is to be understood that the finger-like structures 39, 40, and 42 are to be representative of the various fine structural features that are formed at the device sites, such as, for example, the finger-like projections of a MEMS device. Thus, any number of finger-like structures can be created at a given test site to facilitate the indirect monitoring of the formation of substantially similar finger-like projections at actual device sites where, for example, MEMS devices are fabricated. Furthermore, the finger-like structures at the test site(s) can be individually varied in sizes and spacings to properly reflect and mimic the various sizes and spacings of the finger-like projections at the device sites.

In addition to short circuit and capacitive effects, the test site of FIG. 3 can also be employed to test the electrical resistances along the lengths of the structures 39, 40, and 42 by probing the contacts at the distal ends of each structure. As alluded to previously hereinabove, such electrical information may be of particular importance in cases where, for example, part of the structure 40 is to be formed over a cavity. Assuming that the cavity underlies the center portions of structures 39, 40, and 42 and extends laterally under the areas which will form the side lengths of the isolation trench 44, the physical geometry of the bottom of the structures 39, 40, and 42 may somewhat vary from preferred design specifications as a result of bombardment of the etchant which reaches the cavity via trenches 44, 46, and 48 once the trenches breach the cavity. If one or more of the structures 39, 40, and 42 are overetched at the bottom such that the width of the structure is no longer essentially rectangular but is laterally reduced to something resembling a knife-edge, it is then possible that the resistance along the length of that particular finger-like structure may have increased excessively to the point that the devices created at the device sites having fingers of similar configuration and/or surrounding gap width may no longer be within usable specifications and must be discarded. Thus, electrically probing the test site by way of contact pads 50, 52, and 56 provides information which is relevant to this evaluation.

Summarizing, the test site structure of FIG. 2 provides short circuit and capacitive gap information whereas the test site structure of FIG. 3 may provide short circuit information, etch trenching completion information, and capacitive gap and resistance information. Whereas the FIG. 2 structure provides data with respect to only a single gap width represented by trench 32, it is apparent that the number of square semiconductor structures may be expanded to provide a wide range of different-sized gaps which represent all of the different-sized gaps in the manufactured devices formed at the device sites. This is the essence of the structure of FIG. 4 hereinafter described. Similarly, it is apparent that the structure of FIG. 3 may be expanded to provide additional finger-like structures of varying length as well as additional information concerning gap width. This is the essence of the structure of FIGS. 5 and 6 hereinafter described.

Figure 4:
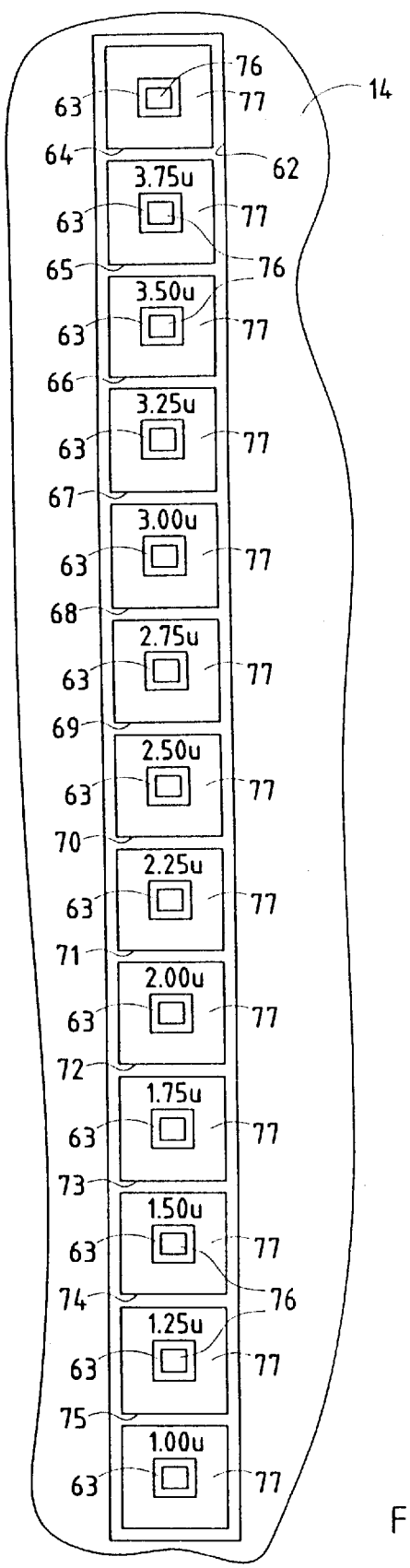
FIG. 4 is plan view of an actual test site used to establish and test for both capacitance and continuity across a relatively wide range.

Expanding upon the test site structure of FIG. 2, FIG. 4 illustrates a test structure of essentially linear configuration defined by an elongate rectangular isolation trench 62 in the semiconductor layer 14. Again, it may be assumed that the test site of FIG. 4 is formed in either one or more of the scribe lanes 20 or on one or more of the die in the wafer of FIG. 1. Within the isolation trench 62, a plurality of cross trenches 64 through 75 are etched in such a way that the gap widths range from 3.75 microns at gap 64 to 1.00 micron at gap 75 with 0.25 micron differences between successive gaps. This provides test site trenches having gap widths which represent and cover the entire range of different-sized gaps formed in the array of devices (not shown):created in the semiconductor layer 14 at the device sites. That is, the twelve gaps in the structure of FIG. 4 are simultaneously formed (that is, etched) along with the different-sized gaps at the device sites and may correspond exactly to the structural gaps or trench widths in the devices manufactured at the device sites; alternatively, the range shown in FIG. 4 may simply define a range which brackets the gaps of interest in the manufactured devices. As shown in FIG. 4, each of the structures within the trenches 62 and 64 through 75 is equipped with an electrically-conductive probe contact 76 and, above the contacts 76, a label indicating the width of the adjacent gap thereby to facilitate optical inspection and/or evaluation of the semiconductor wafer after it has been exposed to the etch treatment. The probe contacts 76 are in electrical contact with semiconductor structures 77, which are defined in the semiconductor layer 14, via holes in oxide layers 63. Consistent with the present invention, it is to be understood that any number of successively-spaced semiconductor structures can be formed with various ranges of different-sized gaps interposed therebetween as is desired.

Figure 5:
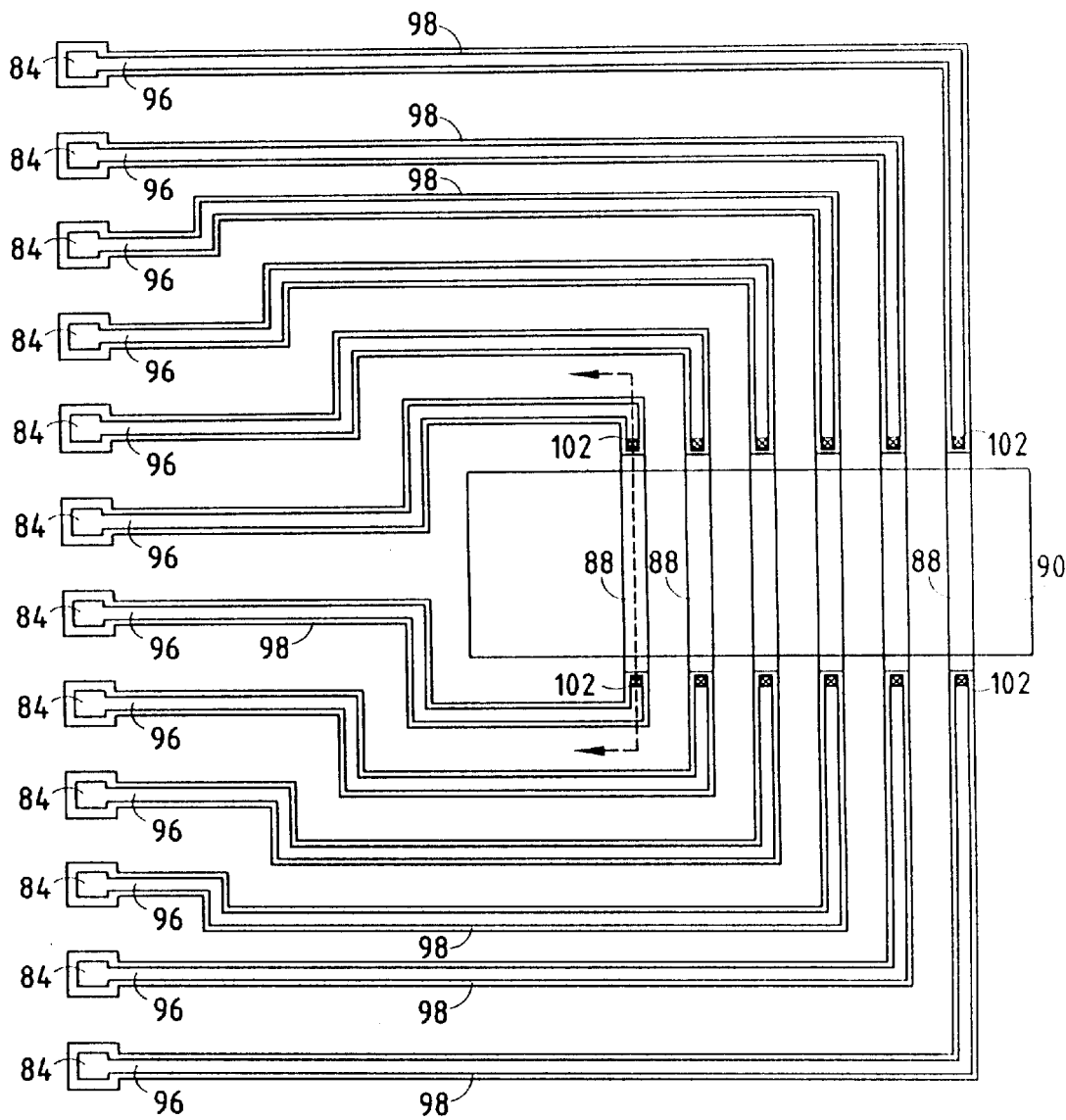
FIG. 5 is a plan view of a second test site geometry useful in testing for minimum gap capacitance, parasitic gap capacitance, isolation gap capacitance, and semiconductor structural resistance in a device, such as an accelerometer, in which the semiconductor structure is characterized by a plurality of long parallel fingers, substantial portions of which are suspended over a cavity.

Expanding upon the test site structure of FIG. 3, FIG. 5 shows a second test site structure wherein long finger-like structures 88 are etched from a semiconductor layer and released over a cavity 90 to facilitate an evaluation of the etch results under these manufacturing conditions. As shown in FIG. 5, the test site structure is characterized by a plurality of long parallel fingers 88 separated by different-sized gaps 92 over a cavity 90. The different-sized gaps 92 can be selected to represent the different types of gaps that can be found, for example, between the micro-mechanical projections (that is, fingers) of MEMS devices which are formed at device sites. For example, the different-sized gaps 92 can be defined at the test site to represent capacitive gaps (that is, gaps which separate electrically conductive MEMS device features, such as interdigitated projections, and facilitate strong coupling), parasitic gaps (which are wider than the capacitive gaps and facilitate weaker to negligible capacitive coupling), and/or substantially non-capacitive gaps (which are wider than the parasitic capacitive gaps and facilitate negligible to no capacitive coupling). In addition, the structures 88 are preferably sized and spaced apart over the cavity 90 to simulate the etch and release of substantially similar projections at the device sites. That is, the widths, thicknesses, lengths, and number of the structures 88 themselves (as well as the dimensions of the cavity 90) can all be varied and tailored to substantially represent the fine features of devices (such as the finger projections of MEMS devices) fabricated at device sites.

Figure 6:
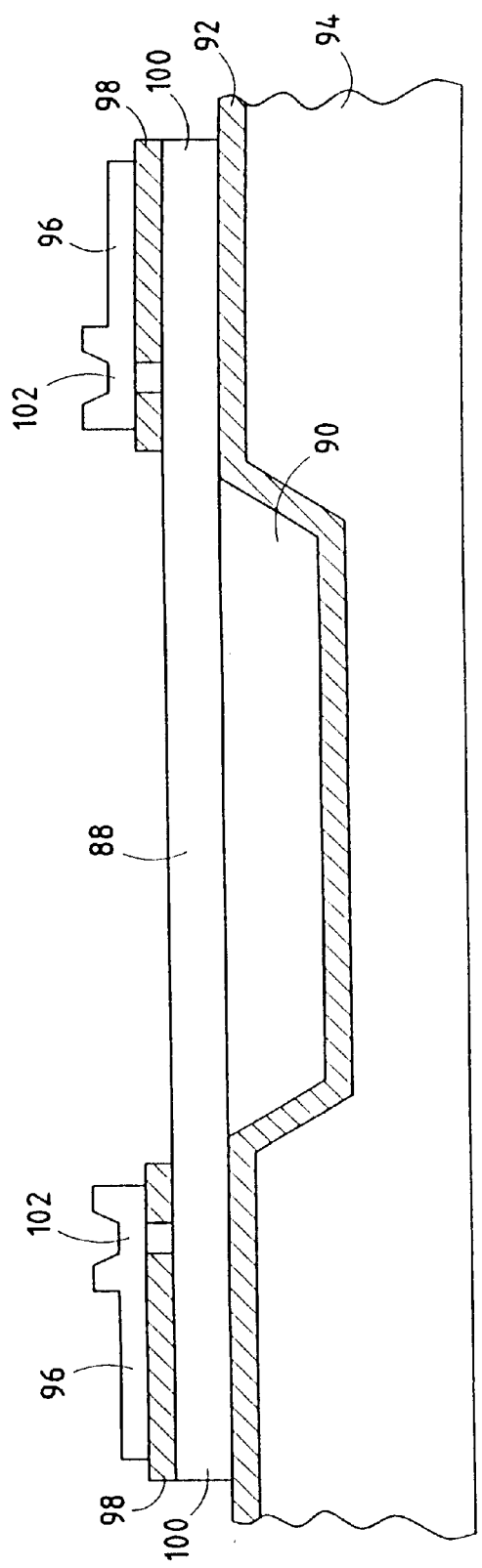
FIG. 6 is a cross-sectional view of FIG. 5 along the line of A to A'.

As illustrated in FIG. 6, the structures 88 are formed and anchored upon an oxide layer 92 which covers a substrate 94. As shown in FIG. 5, the distal ends of the structures 88 are electrically connected to probe pads 84 via electrically-isolated metal lines 96. The metal lines 96 are electrically connected to the distal ends of the structures 88 via buried contacts 102 which are defined through oxide layers 98. Underneath each of the metal lines 96 is an electrically-isolating oxide layer 98. The oxide layer 98 is formed over a semiconductor layer 100. The semiconductor layers 100 for each of the metal lines are electrically isolated from each other upon the oxide layer 92.

Electrically testing and characterizing the structures 88 in FIG. 5 is carried out similar to the testing and characterizing regarding to FIG. 3. The test site structure in FIG. 5, however, is preferred, for the probe contacts 84 are linearly aligned to permit the electrical characterization of the structures 88 via a standard probe card having linearly aligned probe tips. Furthermore, it is important to note that the structures 88 are uniquely spaced apart. In this particular embodiment, the first (going from right to left) structure 88 is formed so that it particularly has a non-capacitive gap and a parasitic capacitive gap on either side of it. The second structure 88 is formed so that it has a parasitic capacitive gap and a minimum capacitive gap on either side of it. The third structure 88 is formed so that it has a minimum capacitive gap on both sides of it. The fourth structure 88 is formed so that it has a minimum capacitive gap and a parasitic capacitive gap on either side of it. The fifth structure 88 has a parasitic capacitive gap and a substantially non-capacitive gap on either side of it. Lastly, the sixth structure 88 is formed so that it has a substantially non-capacitive gap and a non-capacitive gap on either side of it. Thus, FIG. 5 demonstrates that, according to the present invention, any number of structures 88 can be created and uniquely and strategically spaced apart to thereby simulate any and all gap (trench) spacing scenarios to thereby facilitate the thorough monitoring and characterizing of the etching of similarly situated structures at the device sites on the other wafer die. As briefly alluded to previously hereinabove, the widths of the structures 88 can also be uniquely and strategically varied as well. In this way, the different gap spacings (trenches) between the projections of an actual device can be simulated and tested via the test site to thereby indirectly determine whether the projections of, for example, the MEMS devices at the device sites have been properly formed.

As alluded to earlier hereinabove, FIG. 6 is a cross-sectional view of FIG. 5 along the line of A to A'. This figure particularly highlights the finger structure 88 over the cavity 90.

As alluded to hereinabove, it is generally desirable to arrange the contacts 76 in FIG. 4 and the contacts 84 in FIG. 5 in a line so that they can be electrically engaged with the in-line probe tips of a standardized probe card.

By way of summary, a semiconductor wafer or layer is discretized so as to define an array of devices to be manufactured and, at the same time, to define one or more test sites having structural characteristics which create and/or represent electrical properties such as resistance and capacitance that are found in the manufactured devices at their respective device sites. In the simplest case, the structure of the test sites may be such as to define isolated minimum capacitive gaps, and probe contacts are provided on opposite sides of the minimum capacitive gap or gaps to permit them to be electrically probed and checked for short circuits and capacitive coupling after completion of the etch treatment. To evaluate a more complex structure such as that associated with an accelerometer or other MEMS device, the test site structure may include fingers formed in part over a cavity and equipped with leads and/or probe contacts at the opposite ends to measure not only to detect short circuits and measure capacitance between fingers, but also to measure resistance along the length of the finger as described above. The invention is not restricted to any particular etch treatment or semiconductor material or to any particular dimensions or dimensional range, or method of device formation or manufacture.

What is claimed is:

1. A method of testing an array of electronic or mechanical devices which are batch-formed from an essentially continuous layer of semiconductor material to determine the effect of the batch forming medium on the physical and electrical properties of the devices formed thereby using test sites comprising the steps of:

a) forming electrical test probe contacts in said test sites;

b) discretizing the locations and geometry of said devices in said material layer; wherein said geometry includes the definition of one or more gaps to be formed in said material layer which gaps affect the electrical properties of said devices;

c) discretizing one or more of said test sites in said material layer so as to define, after batch forming, at least one gap which is dimensionally representative of a gap in said device geometry;

d) subjecting the layer to the forming medium; and e) measuring at least one electrical property associated with said test site gap via said probe contacts.

2. A method as defined in claim 1 wherein the discretizing steps include the application of a pattern of material to said semiconductor layer which is resistant to the forming medium.

3. A method as defined in claim 2 wherein said forming medium is an etchant.

4. A method as defined in claim 3 wherein said etchant is a deep reactive ion enchant.

5. A method as defined in claim 1 wherein steps (a), (b), and (c) are performed in any order before step (d).

6. A method as defined in claim 1 wherein the test probe contacts are formed on opposite sides of a test site gap.

7. A method as defined in claim 1 wherein the geometry of a device and a test site after step (d) is such as to define an elongate area of semiconductor material defined by lateral gaps in said semiconductor material as wherein the step of forming test probe contacts includes the formation of test probe contacts at spaced apart locations along said elongate area.

8. A method of batch etching an array of electronic or mechanical devices from an essentially continuous layer of semiconductor materials and, contemporaneously with said etching method, conducting a test to determine the effects of the etchant on the electrical properties of the devices using test sites comprising the steps of:

a) forming electrical test probe contacts in said test site;

b) defining the locations and geometry of said devices in said semiconductor material layer by the application of an etchant resistant material to a surface of said semiconductor layer wherein the geometry includes the definition of gaps in said material layer to be formed by the etchant and which affect the electrical, mechanical, or both the electrical and the mechanical properties of said devices;

c) defining one or more of said test sites in said semiconductor material layer by the application of etchant resistant material so as to define a plurality of graded gaps dimensionally representative of the gaps in a device geometry;

d) subjecting the semiconductor layer to the etchant to simultaneously form said device gaps and said test site gaps with said test site gaps interleaved with said test probe contacts; and e) measuring at least one electrical property associated with said test site gaps.

9. A method as defined in claim 8 wherein steps (a), (b), and (c) are performed in any order before step (d).

10. A method as defined in claim 8 wherein said electrical property is capacitance.

11. A method as defined in claim 8 wherein said electrical property is resistance or electrical continuity.

12. A method as defined in claim 8 wherein the geometry of a device is such as to include a plurality of elongate semiconductor finger portions separated by gaps and the geometry of said test site includes the formation of a plurality of elongate semiconductor fingers separated by gaps, and the step of defining test probe contacts includes the definition of contacts at the terminal portions of individual fingers, and the step of measuring includes the measurement of at least one of the following:

(i) the capacitance across said gaps;

(ii) the resistance along said elongate fingers;

(iii) the resistance across said gaps; and (iv) the electrical continuity across said gaps.

13. In a layer of etched semiconductor material allocated primarily to the formation of semiconductor devices having a geometry which includes at least one capacitive gap of interest:

a test site formed in said semiconductor layer simultaneously with said devices and comprising at least two volumes of semiconductor material isolated from the layer by an isolation trench and from one another by a trench representative of the capacitive gap of interest;

said structure further comprising electrical contact means on said semiconductor structures for permitting the capacitance in the gap of interest to be measured after the etch treatment.

14. In a layer of etched semiconductor material allocated primarily to the formation of semiconductor devices having a geometry which includes at least one capacitive gap of interest:

a test site formed in said semiconductor layer simultaneously with said devices and comprising at least two volumes of semiconductor material isolated from the layer by an isolation trench and from one another by a trench representative of the capacitive gap of interest;

said structure further comprising electrical contact means on said semiconductor structures for permitting the resistance between said two volumes of semiconductor material to be measured as said gap of interest is formed.

15. In an etched semiconductor layer devoted primarily to the formation of semiconductor devices having structures separated from one another by etched trenches:

a test site formed in said layer and having at least one structure representative of the structures in the semiconductor devices;

said structure in said test site being isolated from the remainder of said seimconductor layer by an isolation trench;

said structure in said test site further having electrical probe contacts associated with the distal ends thereof to permit the measurement of the electrical resistance thereof.

16. An apparatus as defined in claim 15 wherein the finger-like semiconductor structure is formed in part over a cavity.

* * * * *